United States Patent
Jeter

(10) Patent No.: US 9,436,387 B2
(45) Date of Patent: Sep. 6, 2016

(54) SYSTEM AND METHOD FOR CALIBRATION OF A MEMORY INTERFACE

(71) Applicant: Apple Inc., Cupertino, CA (US)

(72) Inventor: Robert E. Jeter, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 150 days.

(21) Appl. No.: 14/461,865

(22) Filed: Aug. 18, 2014

(65) Prior Publication Data
US 2016/0048334 A1    Feb. 18, 2016

(51) Int. Cl.
*G06F 21/00* (2013.01)
*G06F 3/06* (2006.01)
*G06F 13/362* (2006.01)
*G06F 13/20* (2006.01)

(52) U.S. Cl.
CPC ........... *G06F 3/0604* (2013.01); *G06F 3/0622* (2013.01); *G06F 3/0632* (2013.01); *G06F 3/0673* (2013.01); *G06F 13/20* (2013.01); *G06F 13/3625* (2013.01); *G06F 2207/388* (2013.01)

(58) Field of Classification Search
None
See application file for complete search history.

(56) References Cited

U.S. PATENT DOCUMENTS

| | | |
|---|---|---|
| 8,588,014 B1 | 11/2013 | Fung et al. |
| 8,619,480 B2 | 12/2013 | Li et al. |
| 8,661,285 B2 | 2/2014 | Lee et al. |
| 2003/0046596 A1* | 3/2003 | Floyd ........................ H04L 1/24 713/400 |
| 2005/0190193 A1* | 9/2005 | Freker ................. G06F 13/1689 345/534 |
| 2010/0205386 A1 | 8/2010 | Yamashita |
| 2011/0283060 A1* | 11/2011 | Ware ................... G06F 13/1636 711/106 |

\* cited by examiner

*Primary Examiner* — Duc Doan
(74) *Attorney, Agent, or Firm* — Meyertons, Hood, Kivlin, Kowert & Goetzel, P.C.

(57) ABSTRACT

A system includes memory unit having one or more storage arrays, and a memory interface unit that may be coupled between a memory controller and the memory unit. The memory interface unit may include a timing unit that may generate timing signals for controlling read and write access to the memory unit, and a control unit that may calibrate the timing unit at predetermined intervals. However, in response to an occurrence of a given predetermined interval, the memory interface unit may be configured to calibrate the timing unit using a number of partial calibration segments.

18 Claims, 4 Drawing Sheets

US 9,436,387 B2

SYSTEM AND METHOD FOR CALIBRATION OF A MEMORY INTERFACE

BACKGROUND

1. Technical Field

This disclosure relates to memory systems, and more particularly to memory interface calibration.

2. Description of the Related Art

Many memory systems require calibration of the timing signals that control memory reads and writes. Calibration is typically required to compensate for such variables as voltage and temperature drift of components in the memory controller, the memory interface and the memory device to which they may be connected. However, in many cases a calibration may take as many as hundreds of microseconds to complete. This amount of time may be unacceptable particularly when for example, real time components may need access to the memory interconnect.

SUMMARY OF THE EMBODIMENTS

Various embodiments of a system and method of calibrating a memory interface are disclosed. Broadly speaking, a memory system includes a memory interface unit that controls read and write access to a memory unit by controlling the timing signals to the memory unit. The memory interface unit may also calibrate the timing signals at predetermined intervals to compensate, for example, process, voltage and temperature drift. In response to an occurrence of a given predetermined interval, the memory interface unit may be configured to calibrate the timing unit by breaking the calibration into a number of calibration segments.

In one embodiment, a system includes memory unit having one or more storage arrays, and a memory interface unit that may be coupled between a memory controller and the memory unit. The memory interface unit may include a timing unit that may generate timing signals for controlling read and write access to the memory unit, and a control unit that may calibrate the timing unit at predetermined intervals. However, in response to an occurrence of a given predetermined interval, the memory interface unit may be configured to calibrate the timing unit using a number of partial calibration segments.

In one particular implementation, the control unit may initiate a first partial calibration segment in response to the occurrence of the given predetermined interval. In addition, the control unit may store results of each partial calibration segment and restore to the timing unit results of a last full calibration corresponding to a previous full calibration in response to completion of each partial calibration segment.

Figure 1:
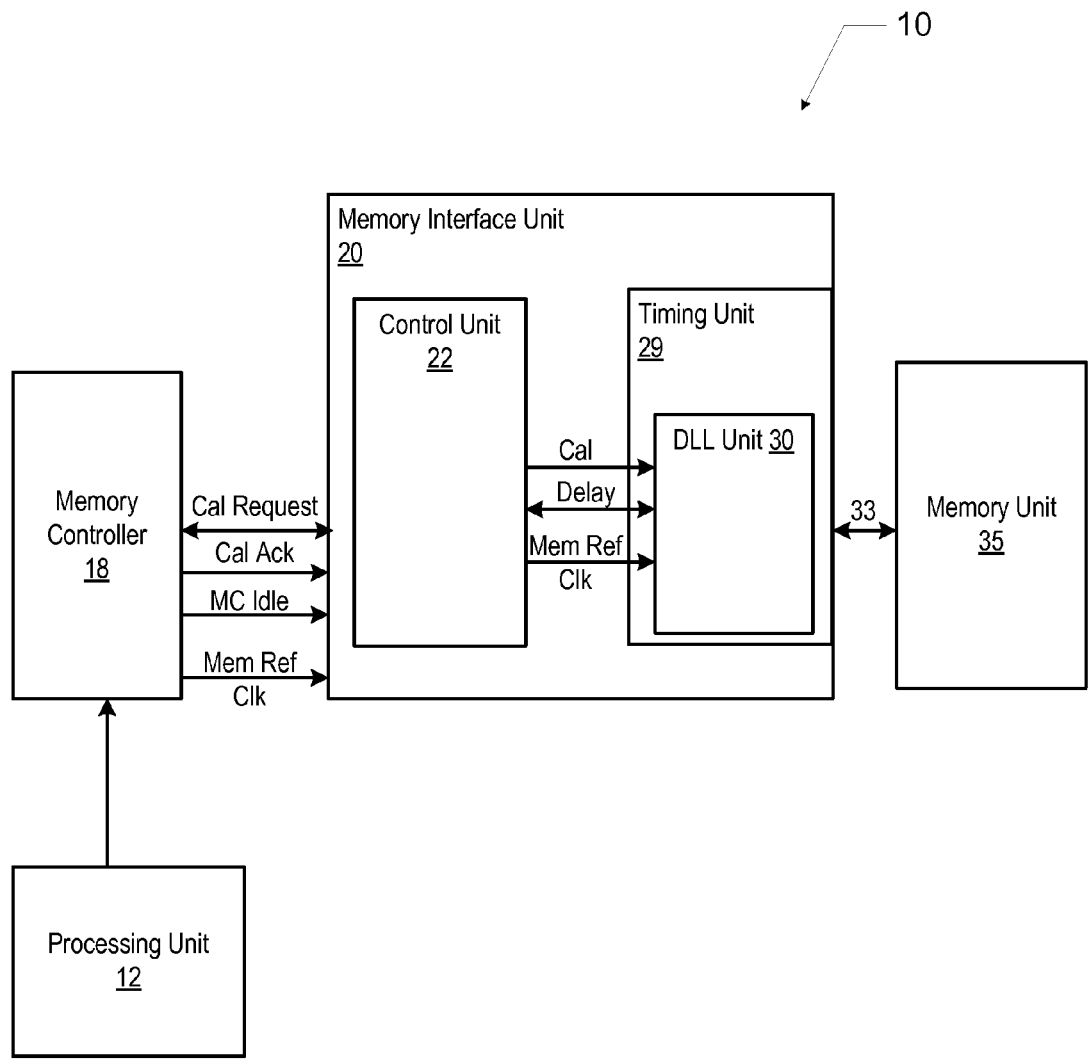
FIG. 1 is a block diagram of one embodiment of an integrated circuit including a memory interface having a DLL and a control unit.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f), interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of an integrated circuit including a memory interface is shown. The integrated circuit 10 includes a processing unit 12 that is coupled to a memory controller 18. The memory controller 18 is also coupled to a memory interface unit 20, which is in turn coupled to a memory unit 35 via a memory interconnect 33. In one embodiment, the integrated circuit 10 may be considered as a system on a chip (SOC).

In various embodiments, the processing unit 12 may include one or more processor cores and one or more cache memories (not shown). The processor cores may execute application software as well as operating system (OS) software. The OS may control various features and functions of the integrated circuit.

The memory unit 35 may be representative of any type of memory. In one embodiment, the memory device 35 may be representative of one or more random access memory (RAM) memory devices in the dynamic RAM (DRAM) family of devices as described below in conjunction with the description of FIG. 4. Accordingly, the memory interconnect 33 may include a number of data paths, data strobe paths, and address and command paths (all not shown).

In one embodiment, the memory interface unit 20 may serve as a memory control and configuration interface. As such the memory interface unit 20 of FIG. 1 includes a control unit 22 and a timing unit 29. The timing unit 29 includes a delay locked loop (DLL) unit 30. In various embodiments, the DLL unit 30 may include a master DLL (MDLL) (shown in FIG. 2) that may be configured to acquire and lock onto a particular edge of a memory reference clock, and one or more slave DLLs (SDLLs) (shown in FIG. 2) that may be configured to provide one or more delayed versions of a second reference clock for use by the memory interconnect 33. More particularly, in one implementation, the MDLL may be used to lock onto the memory reference clock and to provide one or more delay values corresponding used to delay the reference clock signal some number of clock cycles or partial clock cycles. The SDLLs may be used to control clocking on the memory interconnect 33 based upon the delay values provided by the MDLL. In particular, in one implementation the SDLLs may provide clock signals having a phase offset which may be used to place data strobes in the center of the clock window of the memory interconnect 33.

In one embodiment, the control unit 22 may be configured to calibrate and control the operation of DLL unit 30. In one embodiment, control unit 22 may use control registers and a calibration timer (both shown in FIG. 2) to control calibration operations such as training of the MDLL 32 and configuration of the phase delay of each of the SDLLs 34. In one embodiment, the control unit 22 may provide the delay values to the SDLLs 34 to generate clocks with the correct phase offset. In addition, the control unit 22 may provide the training signals to the MDLL 32 during a calibration sequence at predetermined intervals as described further below.

More particularly, as described in greater detail below in conjunction with the description of FIG. 2 and FIG. 3 the control unit 22 may be configured to calibrate the DLL unit 30 at predetermined intervals. Ongoing calibration may be necessary to due to various factors such as process, voltage, and temperature drift of the DLL unit 30 or the memory unit 35 or both. The result of the drift may be that the signal timing shifts to such an extent that data may not be written to or read from the memory unit 35 in a reliable manner. Accordingly, the control unit 22 may request to perform a calibration sequence of the timing unit 29 at the predetermined intervals. If the request is granted by the memory controller 18, the control unit 22 may perform the calibration sequence. The predetermined intervals may, for example, be determined during manufacture based upon the particular manufacturing processing and operating corners of the IC 10, the memory unit 35, or both. It is noted that a variety of calibration methods may be used. For example, in one embodiment, a predetermined data set may be read from the memory unit 35, while the read circuitry is calibrated to read the data. Once the read circuitry is calibrated and the data set is reliably read, the write circuitry may be calibrated. In one embodiment, a predetermined write data set may be written to the memory unit 35, and then subsequently read back.

As mentioned above, a full calibration may take hundreds of microseconds to complete. Depending on the memory traffic, and from/to which components the memory traffic is directed those hundreds of microseconds may be unacceptably long. For example, some real time agents may not able to tolerate large delays in memory accesses. More particularly, a real time agent such as for example, video and display components may need uninterrupted access to memory during display operations. Accordingly, as described in greater detail below the control unit 22 may perform the calibration by breaking up the full calibration into shorter partial calibration segments.

Figure 2:
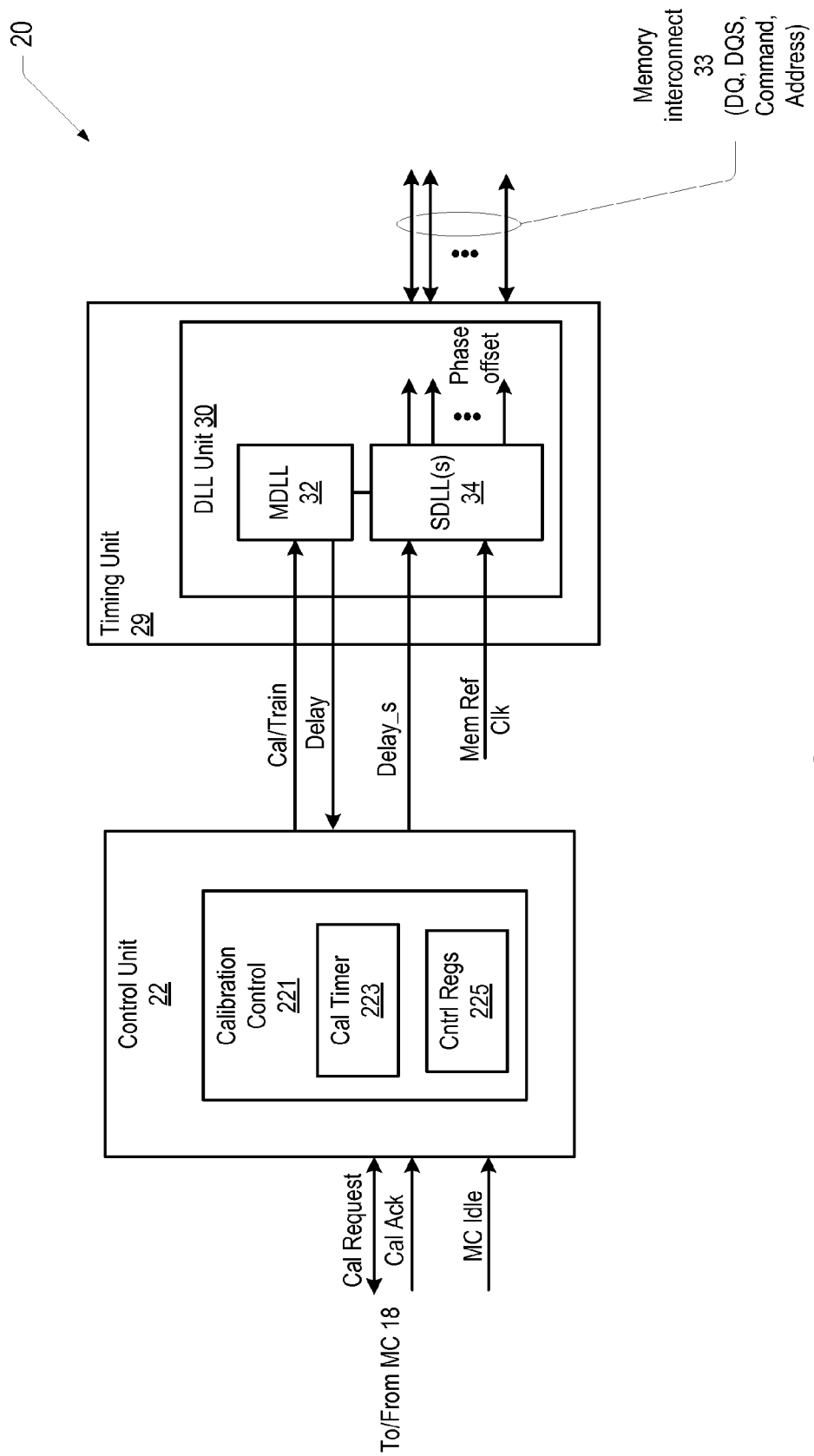
FIG. 2 is a block diagram illustrating more detailed aspects of an embodiment of the memory interface shown in FIG. 1.

Referring to FIG. 2, a block diagram illustrating more detailed aspects of the embodiment of the memory interface unit 20 of FIG. 1 is shown. Components that correspond to those shown in FIG. 1 are numbered identically for clarity and simplicity. The memory interface unit 20 includes the control unit 22, which in turn includes a calibration timer 223 and control registers 225. The memory interface unit 20 also includes the timing unit 29, which includes the DLL unit 30. As shown, the DLL unit 30 includes an MDLL 32, and one or more SDLLs 34. In one embodiment, the timing unit 29 provides the hardware physical layer signaling to the memory interconnect 33. As shown, the SDLLs 34 provide one or more clocks having a phase offset, which may be used by logic within the timing unit 29 to provide data strobes (e.g., DQS), for example.

As described above, the control unit 22 may control the calibration sequence of the timing unit 29. During operation of the IC 10, the calibration timer 223 may be programmed to a particular value. The calibration timer may be any type of timer such as a count up or count down timer as desired. As such, the calibration timer may be configured to count up to or down to the programmed count value, and to notify the control unit 22 when a particular time has elapsed. In response to the calibration timer 223 notification, the control unit 22 may send a calibration request to the memory controller 18.

In an alternative embodiment, in response to the calibration timer 223 notification, the control unit 22 may perform an update of the MDLL 32. During the update, the control unit 22 may obtain the current MDLL delay code from the MDLL 32. The control unit 22 may compare that current MDLL code to the MDLL code stored in control registers 225, for example. In one embodiment, the control unit 22 may have stored the MDLL code in the registers 225 during a last full calibration. If the current MDLL code is different from the stored MDLL code by greater than a predetermined threshold, the control unit 22 may send the calibration request to the memory controller 18. By checking for MDLL code shift prior to requesting a calibration request, the memory interconnect 33 does not have to be shut down for the time required to perform the calibration, unless the calibration is necessary. Thus, the calibration becomes a need-based calibration rather than simply a time-based calibration.

The memory controller 18 may be configured to determine whether the memory interface is too busy to perform a calibration at the time it receives a calibration request. The memory controller 18 may either grant the request with a calibration acknowledgement (Ack) or hold off the control unit 22 for some predetermined and programmable time interval.

If the calibration request is granted, the control unit 22 may initiate the calibration by signaling the MDLL 32 to initiate a training sequence to re-lock onto the memory reference clock (Mem Ref Clk) so that the control unit 22 may obtain new SDLL phase offsets for generation of data strobes. In addition, the control unit 22 may also initiate reads and writes to the memory unit 35 while adjusting various delay elements including SDLLs. Once the new calibration results are obtained, the control unit 22 may write the results to the control registers 225. The calibration results may include calibration timing values, reference voltages, and the like. However, rather than perform an entire calibration sequence at once, the control unit 22 may perform the calibration in segments.

More particularly, in one embodiment, in response to a Cal Ack from the memory controller 18, the control unit 22 may begin obtaining new calibration values for the DLL unit 30 for a programmable amount of time. In one implementation, the calibration timer 223 may also keep track of the calibration elapsed time. For example, the calibration elapsed timer value may be programmed for a couple of microseconds. Once the calibration timer 223 has elapsed, the control unit 22 may store the results of the partial calibration in the control registers 225, and restore the previously calibrated SDLL offset values to the DLL unit 30 from the control registers 225. In another implementation, each calibration segment may have a predetermined number of operations to perform, and once those operations are complete the control unit 22 may store the results of the partial calibration in the control registers 225, and restore the previously calibrated SDLL offset values to the DLL unit 30 from the control registers 225. When a calibration segment finishes, the control unit 22 may retrieve from the control registers the results of the last full calibration that were stored upon completion of the last full calibration and write the results back to the DLL unit 30.

In addition, to continue the calibration sequence the control unit 22 may again request a calibration by issuing the Cal Request to the memory controller 18. In one embodiment, the control unit 22 may assert the Cal Request as soon as it completes each partial calibration segment. The memory controller 18 may either grant the request with the Cal Ack, or if the memory controller 18 determines that the memory traffic is too congested, for example, the memory controller 18 may hold off the control unit 22 for some amount of time. In one embodiment, the memory controller 18 may continue to grant the Cal Ack as long as the memory controller 18 is Idle. In such a case, the current full calibration may be performed one segment after the other in sequence. Once all calibration segments are complete, the control unit 22 may store the results of the current full calibration to the control registers 225, and return to normal operation.

Figure 3:
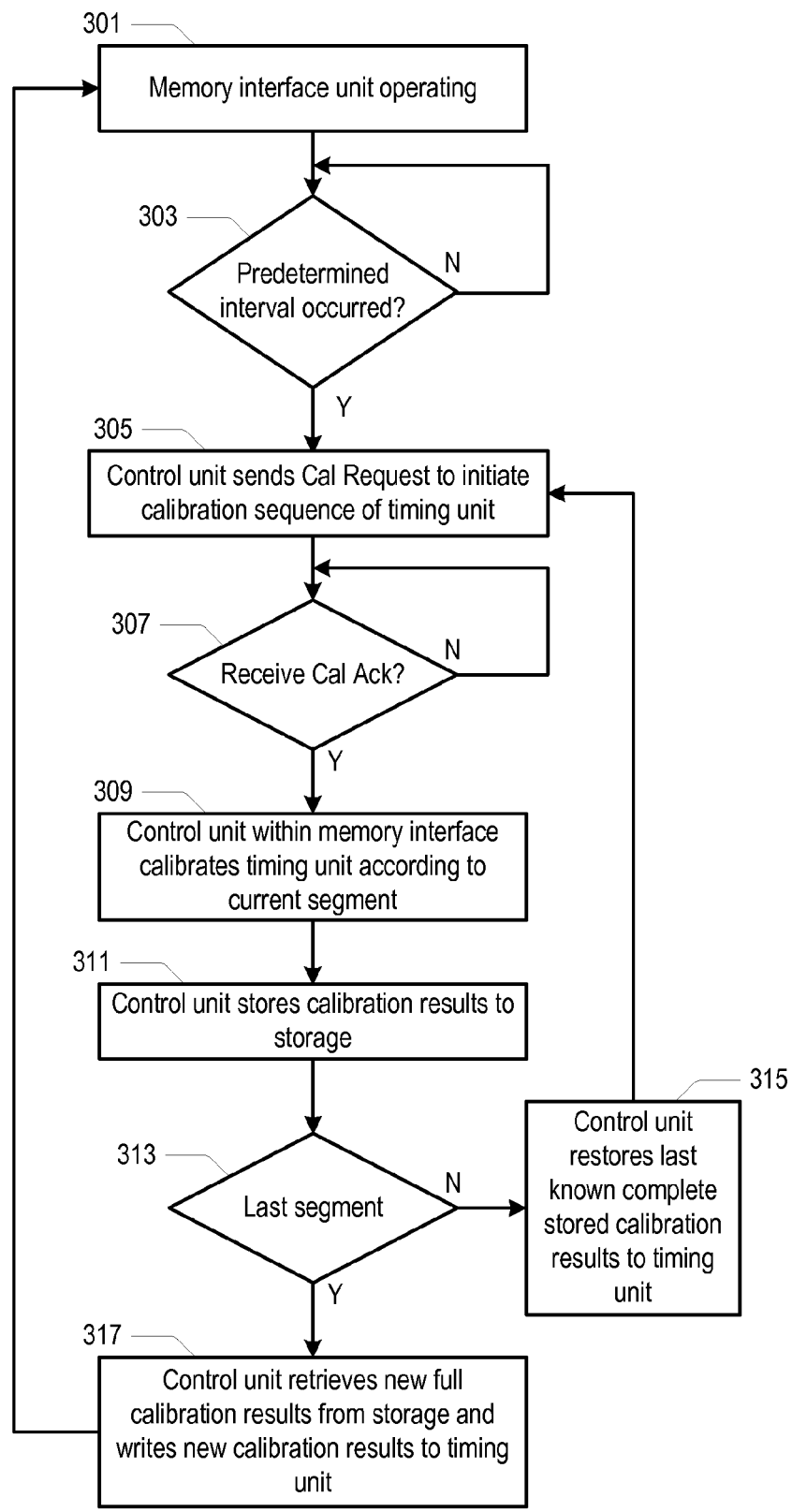
FIG. 3 is a flow diagram describing operational aspects of the memory interface shown in FIG. 1 and FIG. 2.

FIG. 3 is a flow diagram describing operational aspects of the memory interface of FIG. 1 and FIG. 2. Referring collectively now to FIG. 1 through FIG. 3 and beginning in block 301 of FIG. 3, during operation of the IC 10, the memory interface unit 20D may be operating in a normal mode and handling memory requests between the memory controller 18 and the memory unit 35. During this normal mode operation, the calibration timer 223 may be counting up or down since the last calibration of the memory interface unit 20 to measure the elapsed time since the last calibration. If the calibration timer 223 has not been reached the programmable value (which represents the predetermined interval in which the timing unit 29 is calibrated) (block 303) the timer 223 continues counting. However, if the count value has been reached the predetermined calibration interval (block 303), the calibration timer 223 may send a notification to the control unit 22 to initiate the calibration sequence of the timing unit 29 (block 305).

If the control unit 22 does not receive a Cal Ack from the memory controller 18, the control unit 22 waits (block 309). More particularly, the memory controller 18 may hold off the Cal Request for some predetermined amount of time to allow for example, any in-flight memory requests to finish, or to allow any real time agents to finish a memory request. Alternatively, if the memory controller 18 is Idle, the memory controller 18 may immediately issue the Cal Ack. If the control unit 22 receives the Cal Ack from the memory controller 18 (block 307), the control unit 22 may initiate calibration of the timing unit 29 according to the current calibration segment (block 309). For example, if the current segment is the first segment, the first segment calibration operations are performed. Similarly for a next segment or a last segment. Once the results of the partial calibration have been obtained, the control unit 22 may save the results of the partial calibration by writing them to the control registers 225 (block 311).

If the partial calibration segment that just completed is not the last partial calibration segment (block 313), the control unit 22 may retrieve the results of the last full calibration from the control registers 225 and write them to the timing unit 29 (block 315). Operation then proceeds as described above in conjunction with block 305, in which the control unit 22 may send another Cal Request to the memory controller 18.

Referring back to block 313, if the calibration segment that just completed is the last segment the control unit 22 may retrieve the new results of the full calibration from the control registers 225 and write them to the timing unit 29 (block 317). Operation proceeds as described above in conjunction with the description of block 301.

Figure 4:
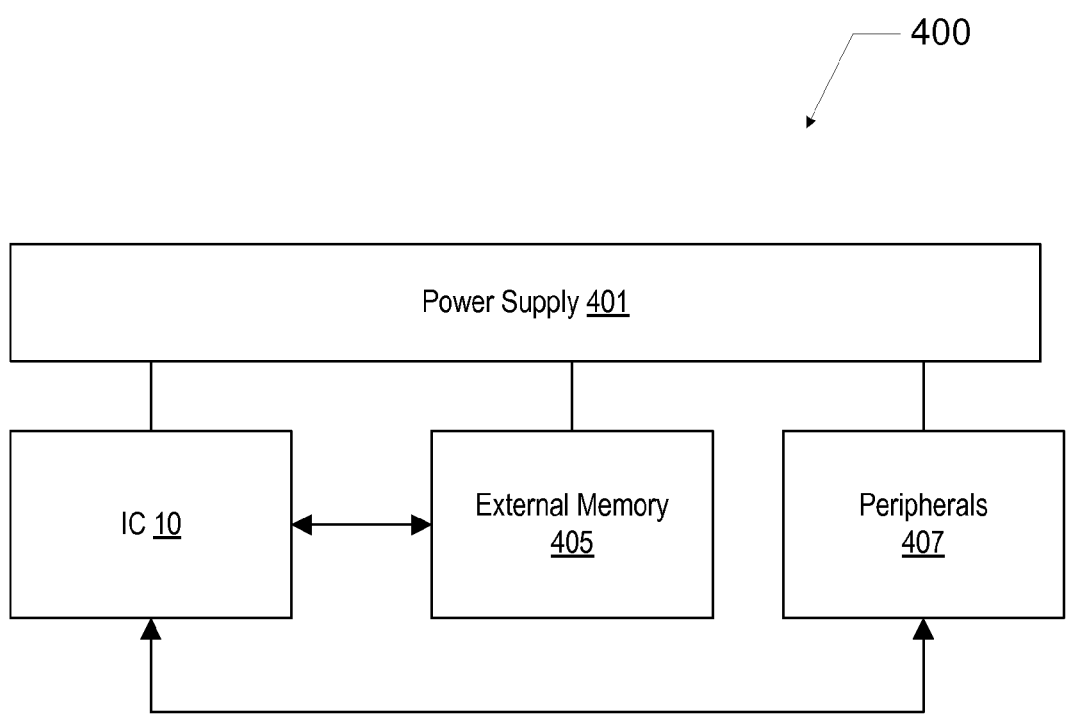
FIG. 4 is a block diagram of one embodiment of a system that includes the integrated circuit of FIG. 1.

Turning to FIG. 4, a block diagram of one embodiment of a system that includes the integrated circuit 10 is shown. The system 400 includes at least one instance of the integrated circuit 10 of FIG. 1 coupled to one or more peripherals 407 and a system memory 405. The system 400 also includes a power supply 401 that may provide one or more supply voltages to the integrated circuit 10 as well as one or more supply voltages to the memory 405 and/or the peripherals 407. In some embodiments, more than one instance of the integrated circuit 10 may be included.

The peripherals 407 may include any desired circuitry, depending on the type of system. For example, in one embodiment, the system 400 may be included in a mobile device (e.g., personal digital assistant (PDA), smart phone, etc.) and the peripherals 407 may include devices for various types of wireless communication, such as WiFi, Bluetooth, cellular, global positioning system, etc. The peripherals 407 may also include additional storage, including RAM storage, solid-state storage, or disk storage. The peripherals 407 may include user interface devices such as a display screen, including touch display screens or multitouch display screens, keyboard or other input devices, microphones, speakers, etc. In other embodiments, the system 400 may be included in any type of computing system (e.g. desktop personal computer, laptop, workstation, net top etc.).

The system memory 405 may include any type of memory. For example, as described above in conjunction with FIG. 1, the system memory 405 may be in the DRAM family such as synchronous DRAM (SDRAM), double data rate (DDR, DDR2, DDR3, etc.), or any low power version thereof. However, system memory 405 may also be implemented in static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a memory unit including one or more storage arrays;

a memory interface unit coupled between a memory controller and the memory unit,
wherein the memory interface unit includes:
a timing unit configured to generate timing signals for controlling read and write access to the memory unit; and
a control unit configured to calibrate the timing unit at predetermined intervals in response to a determination that a current delay code of a Delay-Locked Loop (DLL) is greater than a stored delay code by at least a predetermined threshold value using a plurality of partial calibration segments.

2. The system of claim 1, wherein the control unit is further configured to initiate a first partial calibration segment of the plurality of partial calibration segments in response to the occurrence of the given predetermined interval and the determination that the current delay code of the DLL is greater than the stored delay code by at least the predetermined threshold value.

3. The system of claim 2, wherein the control unit is further configured to store results of each partial calibration segment and to restore to the timing unit results of a last full calibration corresponding to a previous full calibration in response to completion of each partial calibration segment.

4. The system of claim 3, wherein the control unit is further configured to store results of a current full calibration in response to completion of a last partial calibration segment.

5. The system of claim 2, wherein the control unit is further configured to send a calibration request to the memory controller to request initiation of a next partial calibration segment of the plurality of partial calibration segments in response to completion of each partial calibration segment.

6. The system of claim 5, wherein the memory interface unit is further configured to calibrate the timing unit in response to receiving a calibration acknowledgement signal from the memory controller.

7. The system of claim 1, wherein the memory interface unit is configured to store results of each partial calibration segment and results of a full calibration within a storage.

8. The system of claim 1, wherein each partial calibration segment corresponds to a portion of a full calibration of the timing unit.

9. The system of claim 1, wherein each partial calibration segment is performed for a programmable duration.

10. The system of claim 1, wherein each partial calibration segment includes a predetermined number of calibration operations.

11. A method comprising:
generating, by a memory interface unit, timing signals for controlling read and write access to a memory unit that includes one or more storage arrays; and
calibrating the timing signals at predetermined intervals; and
wherein in response to an occurrence of a given predetermined interval, calibrating the timing signals using a plurality of partial calibration segments in response to determining that a current delay code of a Delay-Locked Loop (DLL) is greater than a stored delay code by at least a predetermined threshold value.

12. The method of claim 11, further comprising initiating a first partial calibration segment of the plurality of partial calibration segments in response to the occurrence of the given predetermined interval.

13. The method of claim 12, further comprising storing partial calibration values resulting from each partial calibration segment and restoring last full calibration values from a previous full calibration to a timing unit in response to completion of each partial calibration segment.

14. The method of claim 12, further comprising sending a calibration request to a memory controller to request initiation of a next partial calibration segment of the plurality of partial calibration segments in response to completion of each partial calibration segment.

15. The method of claim 14, further comprising calibrating the timing signals in response to receiving a calibration acknowledgement signal from the memory controller.

16. The method of claim 11, further comprising storing full calibration values in response to completion of a last partial calibration segment.

17. The method of claim 11, further comprising performing each partial calibration segment for a predetermined duration.

18. The method of claim 11, wherein calibrating the timing signals at predetermined intervals includes calibrating the timing signals in response to determining that a difference between a current timing signal of a timing unit of the memory interface and a timing signal obtained during a previous full calibration of the timing unit is greater than a predetermined threshold.

* * * * *